United States Patent [19]

Takahashi et al.

[11] Patent Number: 4,767,142

[45] Date of Patent: Aug. 30, 1988

[54] FORCEPS FOR SEMICONDUCTOR SILICON WAFER

[76] Inventors: Kiyoshi Takahashi, 17-25, Hirai 7-Chome, Edogawa-ku; Kazuo Takahashi, 17-3, Higashi Kasai 2-Chome, Edogawa-Ku, both of Tokyo, Japan

[21] Appl. No.: 30,061

[22] Filed: Mar. 25, 1987

[30] Foreign Application Priority Data

Aug. 1, 1986 [JP]  Japan ................ 61-181474

[51] Int. Cl.$^4$ ............ B25B 11/00; B25J 15/06; H01L 21/68
[52] U.S. Cl. ................ 294/64.1; 285/261; 285/390; 285/397; 403/90; 403/299
[58] Field of Search ............ 294/64.1-64.3; 29/743; 251/321-325; 285/174, 239, 261, 390, 397; 269/21; 403/90, 115, 122, 299

[56] References Cited

U.S. PATENT DOCUMENTS

| 954,927 | 4/1910 | Burdick | 294/64.1 |
| 982,661 | 1/1911 | Dickens | 285/261 X |
| 1,302,028 | 4/1919 | Fuchs et al. | 294/64.1 |
| 1,337,427 | 4/1920 | Beach | 285/397 X |
| 1,743,212 | 1/1930 | Harris | 294/64.2 |
| 3,335,727 | 8/1967 | Spoto | 294/64.1 X |

FOREIGN PATENT DOCUMENTS

| 2628488 | 1/1978 | Fed. Rep. of Germany | 294/64.1 |
| 2631502 | 1/1978 | Fed. Rep. of Germany | 294/64.1 |
| 39874 | 4/1978 | Japan | 294/64.1 |
| 33678 | 3/1979 | Japan | 294/64.1 |
| 6385 | of 1909 | United Kingdom | 294/64.1 |
| 364156 | 1/1932 | United Kingdom | 294/64.1 |

OTHER PUBLICATIONS

IBM Technical Disclosure Bulletin, vol. 24, No. 6, Nov. 1981, "Vacuum Wafer Pick-Up Tip", by Ferrentino et al.

Primary Examiner—Johnny D. Cherry
Attorney, Agent, or Firm—Fleit, Jacobson, Cohn & Price

[57] ABSTRACT

A vacuum-forceps is disclosed. A valve chamber is provided between a first suction passage communicating with an adsorptive member and a second suction passage connected through a suction tube to a vacuum source. A valve member linked to an operating push button is accomodated in the valve chamber. The adsorptive member is rotatable and swayable relative to a forceps body with the aid of a spherical member. A suction tube is connected through a double-coupling to the forceps body. A bypass is provided between the valve chamber and the first suction passage. A semiconductor silicon wafer is adsorbed on an adsorptive plate provided at the tip end of the adsorptive member by actuating the push button and is then moved to a desired position.

16 Claims, 9 Drawing Sheets

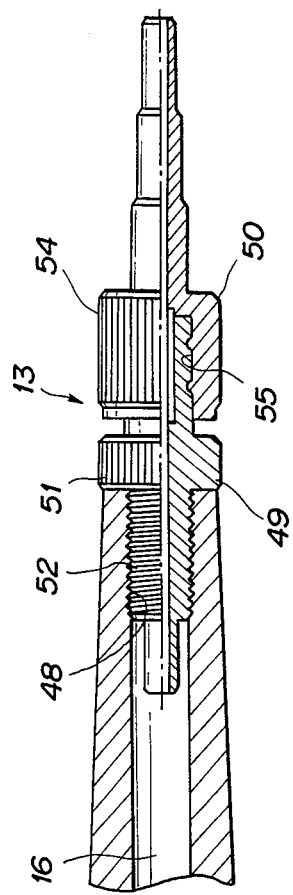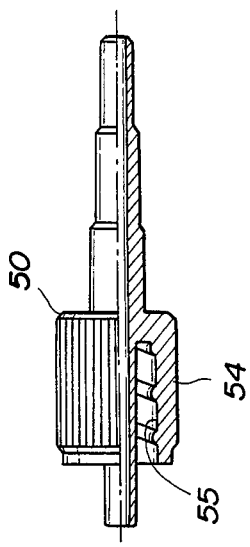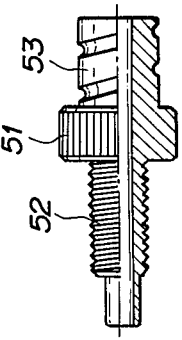

FORCEPS FOR SEMICONDUCTOR SILICON WAFER

BACKGROUND OF THE INVENTION

1. Field of the Invention

The present invention relates to a forceps suitable for moving a single lamina of semiconductor silicon wafer, and more particularly, to a vacuum-forceps for moving the semiconductor wafer while adsorbing it i.e. holding it against a surface of the forceps by utilising a vacuum and for separating the semiconductor silicon wafer by shutting off the vacuum in a desired position.

2. Description of the Prior Art

When processing semiconductor silicon wafers in the course of manufacturing an IC, it is often required to take a single wafer from a multiplicity of the laminated semiconductor silicon wafers for quality inspection or the like. The semiconductor wafer is in itself apt to be damaged. Such being the case, there has heretofore been proposed a vacuum-forceps with which the desired lamina of semiconductor silicon wafer lifted by vacuum adsorption.

In a conventional vacuum forceps, however, rust and corrosion are readily created on the working members of the forceps, which is attributed to the use of a variety of chemical agents for processing the semiconductor silicon wafers. This is likely not only to adversely affect the function of the forceps but also bring about a serious obstacle against the process of manufacture with the result that a good deal of rusty substances may be spread over the factory. In addition, the conventional vacuum-forceps is attended with such a disadvantage that, even if the adsorbing forces are shut off to separate the temporarily adsorbed semiconductor silicon wafer, the vacuum within the forceps does not disappear instantaneously, whereby the separation of the semiconductor silicon wafer is delayed. Furthermore, an adsorptive member of the prior art forceps is fixed in a given position and hence it is necessary that the manipulator changes his posture in accordance with a desired placement of the semiconductor silicon wafer. The conventional vacuum-forceps is simply arranged such that a tube connected to an air suction source is forcibly press-fitted in a rear nozzle of the vacuum-forceps so as to be joined thereto. It is therefore difficult to remove the tube for cleaning the vacuum-forceps after being used for a predetermined period of time, whereby the cleaning becomes impossible unless the separation is made by cutting the tube. In a conventional adsorptive member, a connection hole is formed in an adsorptive plate when joining a ventilation tube to the adsorptive plate; an external thread is formed at the tip end of the ventilation tube; and the two components are joined to each other by fitting this external thread in the connection hole. However, the connection hole is expanded in diameter when screwing the tip of the ventilation tube therein. Distortion due to this expansion in diameter causes roughness on the surface of the adsorptive plate, which undesirably hinders the adsorbing operation.

Accordingly, it is a primary obect of the present invention to provide a vacuum-forceps having its working members composed of non-corrosive fluorine contained resin.

According to one aspect of the invention, there is provided a vacuum-forceps suited to instantaneously separate the adsorbed semiconductor silicon wafer by virtue of an air-hammer phenomenon, the arrangement being such that a bypass is provided separately from vacuum suction passages within the body of the forceps, and the inside of the forceps communicates via the bypass with the atmosphere when shutting off the suction, thereby terminating the vacuum within the forceps.

According to another aspect of the invention, there is provided a vacuum forceps capable of adsorbing the semiconductor silicon wafer under any conditions, this forceps including: a spherical valve which is formed at a proximal end of the adsorptive member and is rotatably and swayably held at the tip of the forceps; and fastening means for fixing the spherical valve.

According to still another aspect of the invention, there is provided a vacuum-forceps which has a double-coupling consisting of a fixation joint screwed to the proximal end of the vacuum-forceps and of an attachable/detachable joint which is screwed to the fixation joint on its one side and is further connected to a suction tube on the other side thereof, this double-coupling permitting the suction tube to be easibly and surely attached to and detached from the body of the forceps.

According to a further aspect of the invention, there is provided a vacuum-forceps wherein a boss-like connection tube internally formed with a connection hole is provided on the wall of the proximal end of the adsorptive plate at the tip end of the adsorptive member, the tip of a ventilation tube is screwed in or press-fitted in the connection hole of the connection tube, and no distortion is created on the surface of the adsorptive plate even if the connection hole is expanded in diameter on account of the press-fitting process or screwing-in process.

According to an additional aspect of the invention, there is provided a vacuum-forceps, suitable for protecting the surface of the semiconductor silicon wafer, wherein at least a resilient impingement surface is formed on the adsorptive plate, and an adsorption ventilating groove is so formed therein as to encompass the resilient impingement surface in order to improve an adsorbing efficiency.

These and other objects, features and advantages of the invention will become more apparent on reading the following description of the preferred embodiments with reference to the accompanying drawings.

SUMMARY OF THE INVENTION

In accordance with the invention, there is provided a vacuum-forceps comprising: first and second suction passages which coordinate in their longitudinal direction; a valve member slidable in such a direction as to intersect the first and second suction passages, this valve member being disposed between these two passages; operating means which extends from one side of the forceps body, this operating means being fitted to the valve member; biasing means, secured to the valve member, for biasing the valve member towards the operating means; an adsorptive member disposed at the tip end of the first suction passage, i.e., at the tip end of the forceps body; and a double-coupling, disposed at the proximal end of the second suction passage, viz., at the proximal end of the forceps body; wherein the said adsorptive member consists of an adsorptive plate formed at the tip end thereof, a spherical valve disposed at the proximal end thereof and a ventilation tube for permitting the adsorptive plate to communicate with the spherical valve; a spherical seating face is so provided at the tip of the forceps body so as to encompass the first suction passage; a surface of the proximal end of the spherical valve impinging upon the spherical seating face; fastening means which impinges upon a surface of the tip end portion of the spherical valve and which engages with the forceps body. The adsorptive member may be rotatably and swayably carried on the the forceps body; the adsorptive member can be fixed in an arbitrary arrangement by virture of a function of the fastening means; and the first suction passage includes a bypass which performs functions to make the first suction passage communicate with the atmosphere, to cause the vacuum in the first suction passage to escape to the atmosphere and to simultaneously lead the atmosphere into the first suction passage, when the communication between the first suction passage and the second suction passage is shut off by actuating the valve member.

BRIEF DESCRIPTION OF THE DRAWINGS

FIG. 5 is an enlarged schematic part-sectional side view of a proximal end of the vacuum-forceps of FIG. 1, showing a double-coupling with parts broken away;

FIG. 6 is a schematic part-sectional side view showing a fixation joint of the double-coupling depicted in FIG. 5 which is directly fitted to the forceps body;

FIG. 7 is a schematic part-sectional side view showing an attachable/detachable joint, connected to a suction tube, of the double-coupling of FIG. 5;

DESCRIPTION OF THE PREFERRED EMBODIMENTS

Figure 1:
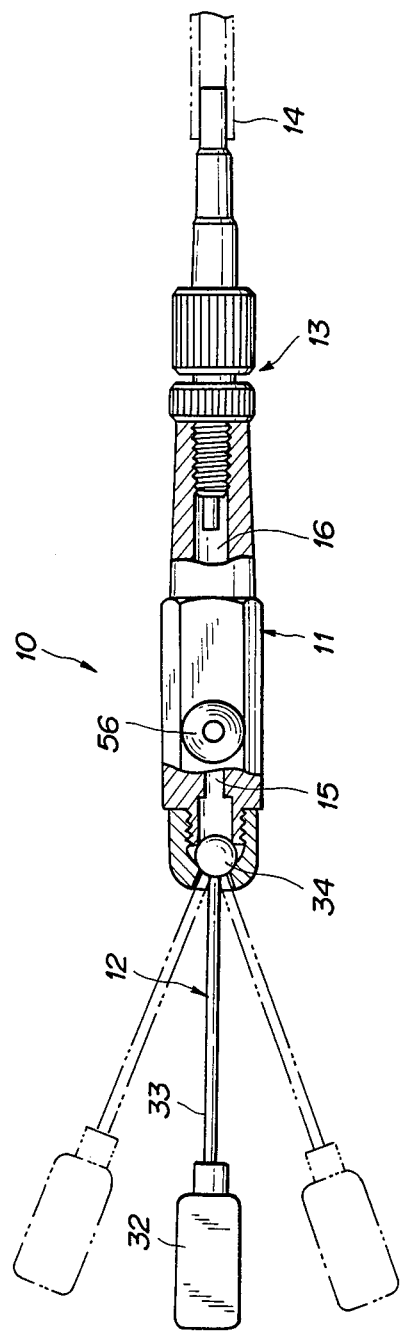
FIG. 1 is a schematic plan view of a vacuum-forceps with parts partially broken away in one embodiment of the present invention, depicting variations in operational placement of an adsorptive member in chain-dotted lines.
Figure 3:
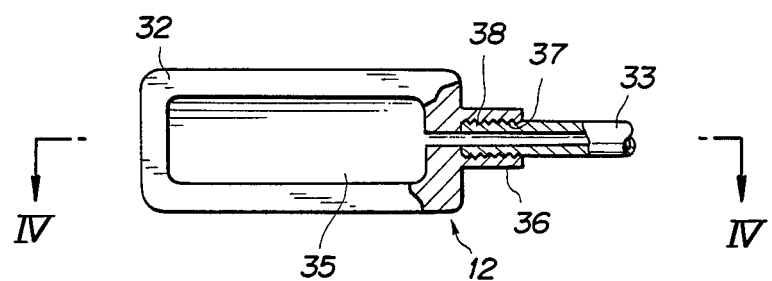
FIG. 3 is a schematic diagram of the adsorptive member viewed from the adsorptive plate, parts being broken away.
Figure 4:
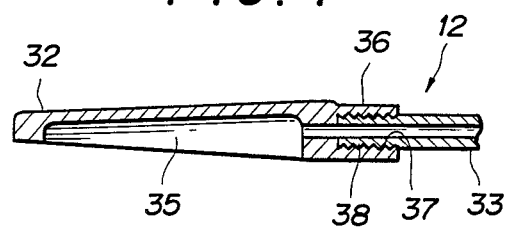
FIG. 4 is a sectional view taken substantially along the line IV—IV of FIG. 3, showing the adsorptive plate.
Figure 9:
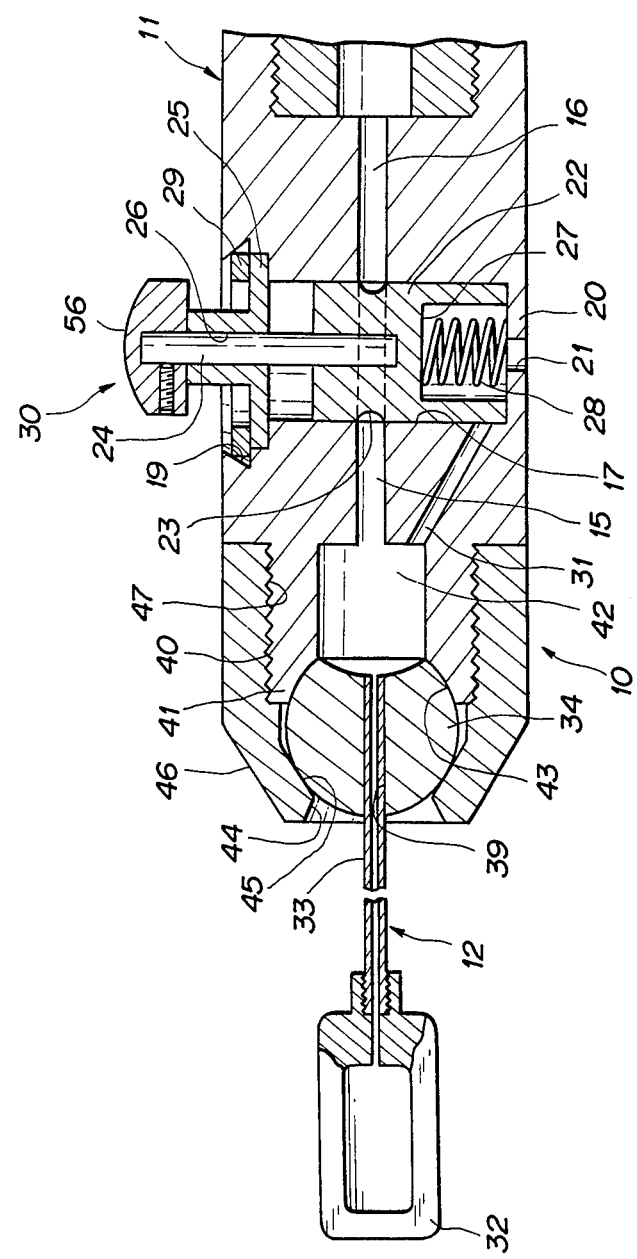
FIG. 9 is a partially enlarged cross-sectional side view, similar to FIG. 2, showing a state where the operating means has moved the valve member to a second terminal position, resisting the bias given by biasing means.

One embodiment of the present invention will hereinafter be described with reference to FIGS. 1, 2. A vacuum-forceps according to the present invention essentially consists of a forceps body 11 formed of Teflon produced by Du Pont Corp. or polytetrafluoroethylene (PTFE), an adsorptive member 12 and a double-coupling 13. A flexible tube 14 connected to a vacuum source (not illustrated) such as a compressor or the like is connected to a proximal end of the double-coupling 13. The forceps body 11 includes a first suction passage 15 and a second suction passage 16 which extend therethrough in the longitudinal direction thereof. A cylindrical valve chamber 17 extending in such a direction as to intersect the first and second suction passages 15, 16 is formed between these two passages. On one side of the valve chamber 17 is formed a fit-in recessed portion 18 whose diameter is larger than that of the valve chamber 17. A conical hole 19 is so shaped outside the recessed portion 18 that its diameter gradually decreases from the inside to the outside. The outermost end of the hole 19 is on the outer surface of the forceps body 11. The valve chamber 17 is closed with an end wall 20 on the other side thereof. The end wall 20 is formed with an air hole 21 through which the bottom of the valve chamber 17 communicates with the atmosphere. As explained earlier, the forceps body 11 provided with the valve chamber 17 is composed of PTFE. A valve member 22 which is so accommodated in the valve chamber 17 as to be slidably in the intersecting direction is shaped of polychlorotrifluoroethylene (PCTFE) harder than the PTFE in a cylindrical configuration wherein the diameter is the same as that of the valve chamber 17. The valve member 22 includes an annular ventilation groove 23 which is formed around the subtantially intermediate portion thereof. In one end of the valve member 22 is implanted an operating spindle 24. The operating spindle 24 is slidably inserted into a central hole 26 formed in a stopper 25 made of polychlorotrifluoroethylene. A button 56 composed of the PCTFE is attached to an end portion of the operating spindle 24. A spring 25 is disposed between the other end surface 27 (see FIG. 9) of the valve member 22 and the end wall 20; and the valve member 22 is then accommodated in the valve chamber 17. When the stopper 25 is fitted in the recessed portion 18, a split ring 29 is resiliently secured to the inside of the top-conical hole 19, thus constituting an operating means 30. A side wall beneath the valve chamber 17 communicates through a bypass 31 with the tip end portion of the above-described first suction passage 15. It can clearly be observed from FIGS. 3, 4 that the adsorptive member 12 is composed by the adsorptive plate 32, a ventilation tube 33 and a spherical valve 34. The adsorptive plate 32 made of the PCTFE has an adsorptive recessed portion 35 formed therein. On the side of the proximal end of the adsorptive plate 32 is provided a connection tube 36 which extends in the longitudinal direction thereof. This connection tube 36 is internally formed with a connection hole 37 defined as an internal thread hole which communicates with the adsorptive recessed portion 35. An external thread 38 provided at the tip of the ventilation tube 33 is screwed in this connection hole 37, thus connecting the ventilation tube 33 to the connection tube 36. The proximal end of the ventilation tube 33 is, as illustrated in FIG. 9, fixedly fitted in an insertion hole 39 which is so formed as to pass through the central portion of a spherical valve 34 and extends in the longitudinal direction thereof. A fastening external thread 40 is formed on the periphery of the tip end of the forceps body 11, whereby a support cylindrical member 41 is constituted integrally with the tip end thereof. This support cylindrical member 41 includes a space 42 formed therein which communicates with the first suction passage 15. The end surface at the tip end of the support cylindrical member 41 is provided with a seating face 43 surrounding said first suction passage 15 and having a curvature equal to that of the spherical valve 34. A surface on the side of the proximal end of the spherical valve 34 is rotatably and swayably supported on this seating face 43 and prevents air-leakage between them. The tip of cylindrical member 46 is formed with an opening 44 the diameter of which is smaller than that of the spherical valve 34. A press-edge 45 is provided on the circumference of the opening 44, thus constituting a fastening cylindrical member 46 composed of the PCTFE. A fastening internal thread hole 47 adaptable for fastening external thread 40 is formed in the inner peripheral surface on the side of the proximal end of the fastening cyindrical member 46. In such a construction, the spherical valve 34 engages upon the seating face 43 of the support cylindrical member 41. Subsequently, when the external thread 40 is screwed in the internal thread hole 47 by inserting the adsorptive member 12 into the fastening cylindrical member 46 from its tip end portion, the spherical valve 34 is sandwiched in between the press-edge 45 and the seating face 43.

Referring to FIGS. 5, 6, 7, a fixation internal thread hole 48 communicating with the second suction passage 16 is formed in the proximal end of the forceps body 11. The double-coupling 13 is installed with the aid of this fixation internal thread hole 48. To be more specific, the double-coupling 13 consists of the fixation joint 49 made of the PCTFE and the attachable/detachable joint 50 made of the same material. The fixation joint 49 includes; a fixation external thread 52 provided at the tip end thereof; an attachable/detachable external thread 53 having a comparatively large screw thread and root width, this external thread 53 being formed on the circumference of the proximal end thereof and relatively small in length; and a drive ring 51 provided in a substantially intermediate portion thereof in such a manner that it is interposed between the two threads 52, 53. The attachable/detachable joint 50 connected to the suction tube 14 on the side of the proximal end includes: a drive ring 54 provided on its circumference; and an attachable/detachable internal thread hole 55 formed along the inner peripheral surface of the tip end portion thereof, this internal thread hole 55 having a screw thread and root width which are, as in the case of the external thread 53, relatively large. The external thread 53 is fitted in the internal thread hole 55, whereby the two joints 49, 50 are attachably and detachably connected to each other. The double-coupling 13 is secured to the forceps body 11 by inserting the external thread 52 into the internal thread hole 48.

Figure 2:
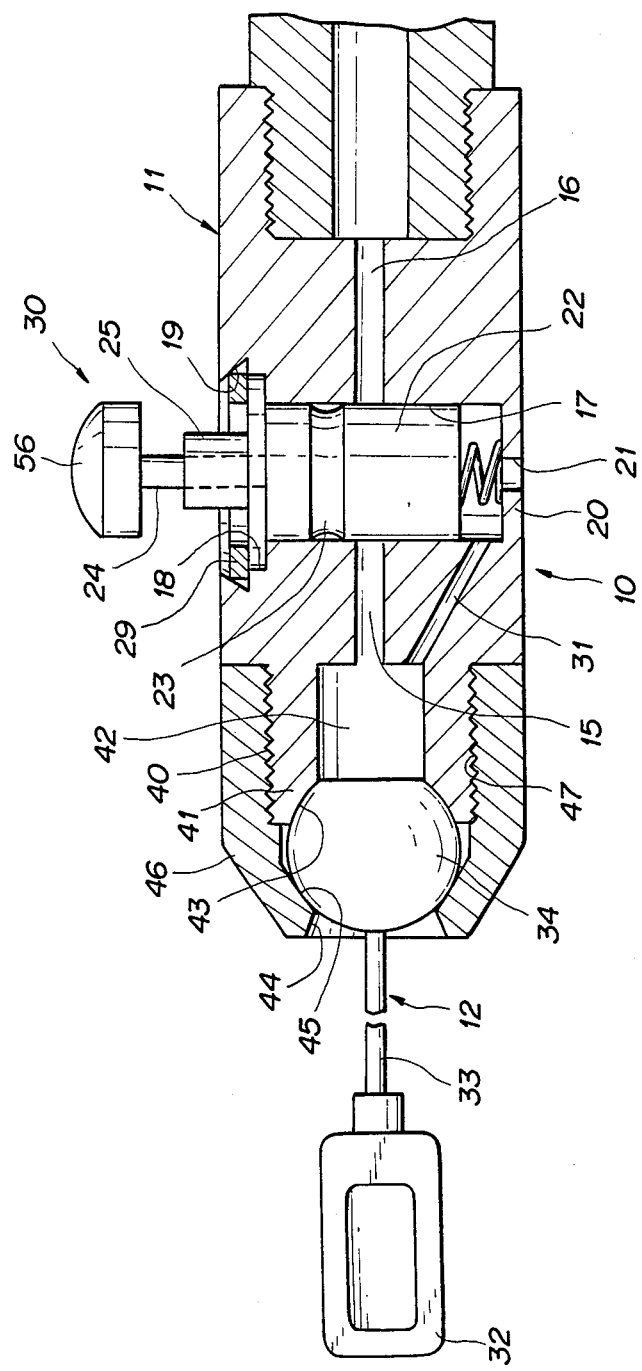
FIG. 2 is a partially enlarged cross-sectional side view of the vacuum-forceps of FIG. 1, showing a state where a valve member is in a first terminal position.

In a rest condition shown in FIG. 2, the valve member 22 is biased towards a first upper terminal position by spring 28, in which position the annular ventilation groove 23 of the valve member 22 does not connect the first and second suction passages 15, 16 with each other. Consequently, the communication between the two suction passages 15, 16 is shut off. As a result, even if the second suction passage 16 is connected through the double-coupling 13 and the suction tube 14 to a vacuum source (not illustrated), no negative pressure is generated in the first suction passage, viz., in the adsorptive recessed portion 35 of the adsorptive plate 32. Therefore the forceps body 11 bundle to adsorb a silicon wafer. However, when the manipulator grasping the forceps body 11 pushes in push button 56 with his finger, the valve member 22 downwardly moves to a second terminal position shown in FIG. 9, overcoming the resilient forces of the spring 28. The foregoing annular ventilation groove 23 coordinates with the first and second suction passages 15, 16, and at the same time a side surface of the lower end of the valve member 22 closes the bypass 31. In this state, the first and second suction passages 15, 16 communicate through the intermediary of the annular ventilation groove 23 with each other and hence negative pressure is created in the adsorptive recessed portion 35 formed in the adsorptive plate 32. This causes the silicon wafer to be adsorbed on the surface of the adsorptive plate 32.

In order to separate the adsorbed silicon wafer from the adsorptive plate 32, the following steps are required. Upon release of the push button 56, the valve member 22 upwardly reverts to the first terminal position shown in FIG. 2 owing to the resilent forces of the spring 28. Then, the communication between the first suction passage 15 and the second suction passage 16 is shut off, and at the same instant the bypass 31 communicating with the first suction passage 15 is connected to the space formed underneath the valve chamber 17 by virtue of ascent of the valve member 22. The residual vacuum within the first suction passasge 15 is therefore dissipated to the atmosphere through the bypass 31 and an air hole 21. At this time, the pressure is offset because of the communication with the atmosphere, whereby the atmospheric pressure enters the first suction passage 15. In consequence, the adsorbed silicon wafer is instantaneously separated from the adsorptive plate 32 by virtue of the air-hammer phenomenon.

Figure 10:
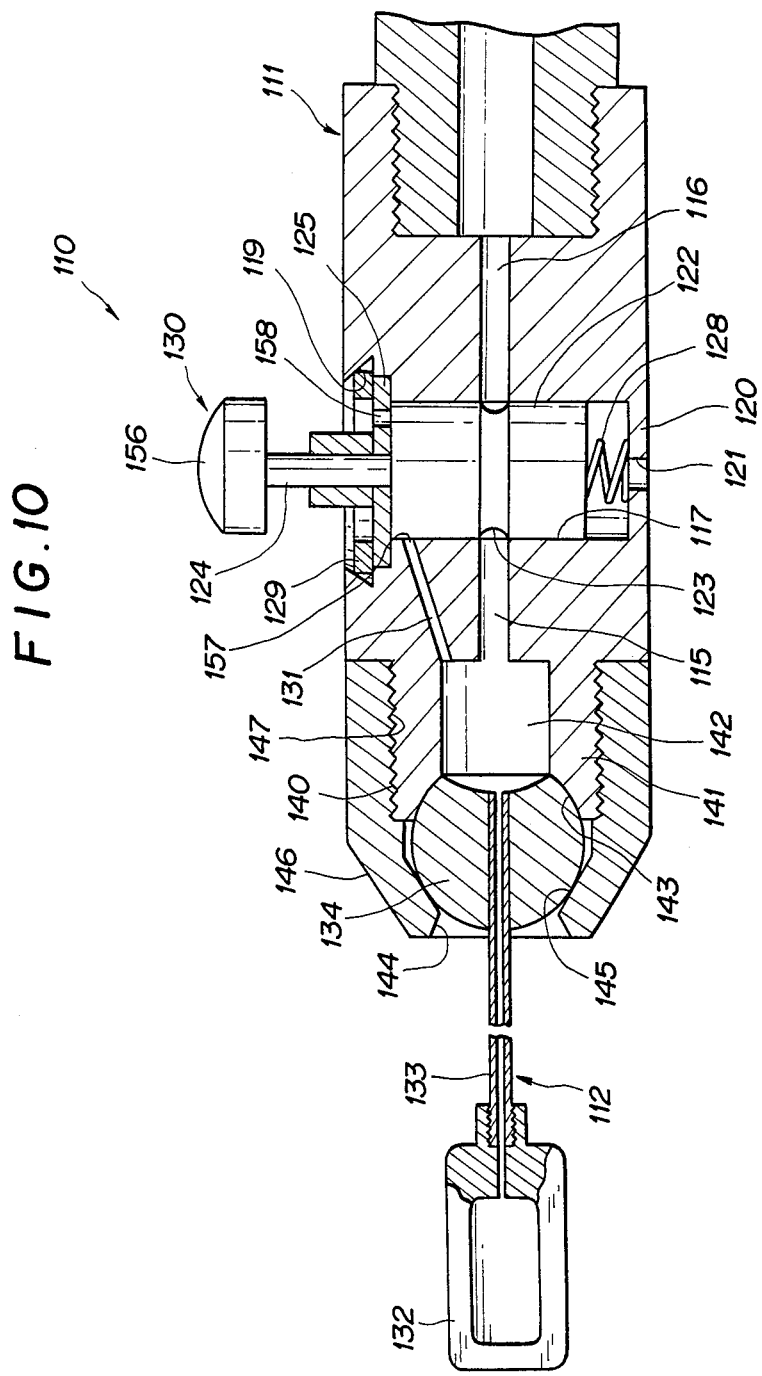
FIG. 10 is a partially enlarged cross-sectional side view of the vacuum-forceps, showing another embodiment of the present invention.

FIG. 10 shows another embodiment of the present invention. The vacuum-forceps 110 in this embodiment is arranged as follows. A valve member 122 is in a first terminal position when raised, at which time an annular ventilation groove 123 is formed in such a position as to coordinate with the first and second suction passages 115, 116. An outlet 157, open to a valve chamber 117, of a bypass 131 communicating with the first suction passage 115 is formed in the side surface of the upper end of the valve chamber 117. A stopper 125 is formed with an air hole 158 through which the upper end of the valve chamber 117 communicates with the atmosphere. Other configurations are the same as those of the first embodiment.

According to the embodiment of FIG. 10, in the first terminal position, i.e., in a non-operating state, the silicon wafer is adsorbed. While on the other hand, in the second terminal position wherein a push button 156 is manipulated, the silicon wafer is separated.

The above-mentioned spherical valves 34, 134 are supported on the spherical seating faces 43, 143 which are identical with each other in configuration, so that the adsorptive members 12, 112 rotate about the ventilation tubes 33, 133 serving as axes. With this arrangement, a change to the direction in which the adsorptive members 32, 132 are placed becomes possible, and further it is practicable to swing in any directions the ventilation tubes 33, 133. Proper fixation can be made by a step wherein the support cylindrical members 41, 141 are fastened by the fastening cylindrical members 46, 146.

Figure 11:
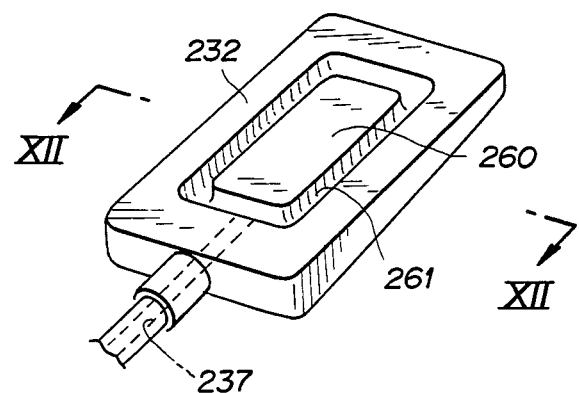
FIG. 11 is a schematic perspective view of the adsorptive plate viewed from the adsorbing surface, showing another example thereof.
Figure 12:
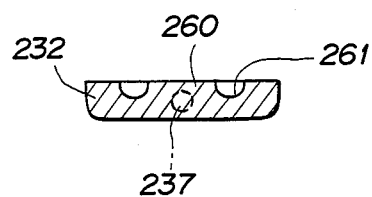
FIG. 12 is a sectional view taken substantially along the line XII—XII of FIG. 11.

FIGS. 11, 12 in combination show an example of another type of adsorptive plate 232. In this example, instead of the adsorptive recessed portion of the adsorptive plate 232, an adsorptive ventilation groove 261 leading to a connection hole 237 is formed along the circumference of a resilient impingement surface 260 which is flush with the adsorptive surface thereof.

Figure 13:
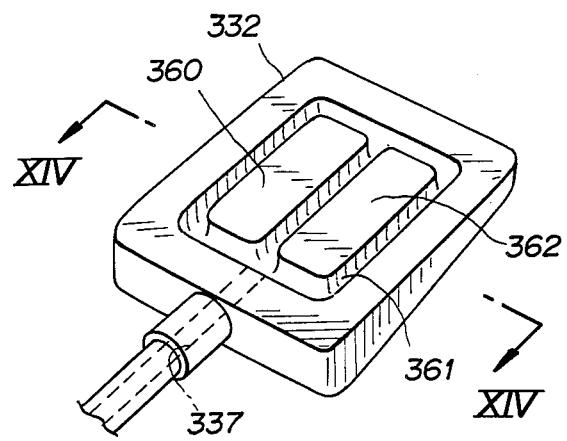
FIG. 13 is a schematic perspective view of the adsorptive plate viewed from the adsorbing surface, showing still another example thereof.
Figure 14:
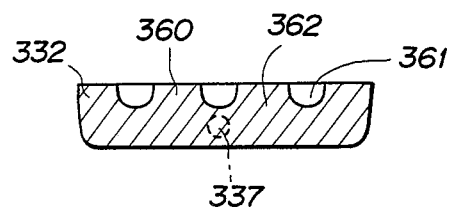
FIG. 14 is a sectional view taken substantially along the line XIV—XIV of FIG. 13.
Figure 15:
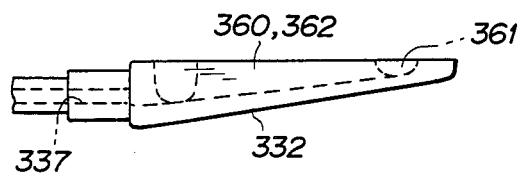
FIG. 15 is a side view of the adsorptive plate of FIG. 13.

Referring to FIGS. 13, 14, 15, there is shown still another example of adsorptive plate 332. In place of the foregoing adsorptive recessed portion, an adsorptive groove 361 communicating with a connection hole 337 is so formed in the adsorptive surface to constitute a plurality of resilient impingement surfaces 360, 362 which are flush with the adsorptive surface. The groove 361 is shaped such as to extend along the circumferences of surfaces 360, 362.

Figure 16:
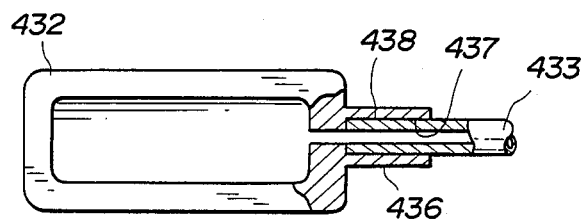
FIG. 16 is a plan view of the adsorptive plate, showing a further example thereof.

If necessary, the following arrangement is, as illustrated in FIG. 16, possible. No external thread is provided at a tip end portion 438 of the ventilation tube 433 to make its peripheral surface smooth. A circular connection hole 437 of the connection tube 436 of the adsorptive plate 432 is similarly rendered smooth. The tip end portion 438 is press-fitted into the connection hole 437, thereby connecting the ventilation tube 433 to the adsorptive plate 432. The ventilation tube 433 and the connection hole 437 are formed with no external and internal threads, which brings about a decrease in thickness of the connection tube 436. Furthermore, this facilitates insertion of the adsorptive plate in between the laminated silicon wafers adjacent to each other. In this example, if necessary, the ventilation tube 433 and/or the connection hole may assume such a configuration that they or it tapers(s) off somewhat from the proximal end to the tip end thereof.

Figure 8:
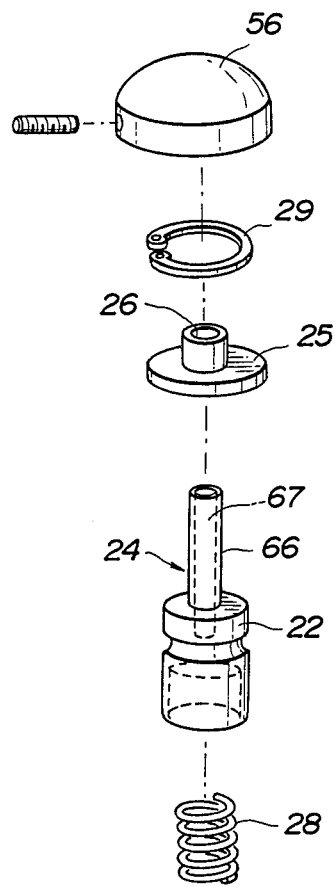
FIG. 8 is an exploded perspective view of operating means of the vacuum-forceps depicted in FIG. 1.

In the vacuum-forceps according to the present invention, the individual working members are composed of fluorine contained resin and it is therefore feasible to prevent occurrence both of rust and of corrosion. As necessity arises, an operating spindle 24 may, as illustrated in FIG. 8, be arranged in such a way that a metallic core member 67 is embedded into a shaft 66 made of the PCTFE to reinforce the body itself. The spherical valve 34 may be formed of the PCTFE, and if necessary, the circumference of the ventilation tube 33 may be coated with the PCTFE. The valve member is shaped of the fluorine contained resin having relatively high hardness, and the valve chamber in which the valve member is accommodated is composed of the fluorine contained resin having comparatively low hardness. As a result of this constitution, closing/unclosing operations of the valve member become smooth by virtue of self-lubrication between the two members. The adsorptive member is connected to the forceps body 11 by means of the spherical valve member and the fastening member and hence it is rotatable and swayable, thereby making it possible to freely set its position. Inasmuch as the forceps body is connected through the double-coupling to the suction tube, it is feasible to quickly and readily attach/detach the suction tube to/from the forceps body. Since the adsorptive plate is formed with a resilient impingement surface and with the adsorptive ventilation groove which surrounds this resilient impingement surface, damage of the silicon wafer can be prevented, and at the same time the adsorbability can be improved.

As many apparently widely different embodiments of this invention may be made without departing from the spirit and scope thereof, it is to be understood that the invention is not limited to the specific embodiments thereof except as defined in the appended claims.

What is claimed is:

1. A vacuum-forceps comprising: a forceps body including first and second suction passages which coordinate with each other in a longitudinal direcaton and a valve chamber so disposed as to intersect said two suction passages, said forceps body being composed of anticorrosive material having a relatively low hardness;

a valve member formed of an anticorrosive material having a comparatively high hardness, said valve member being accommodated in said valve chamber;

a biasing means for biasing said valve member in one intersecting direction to maintain said valve member in a first terminal position;

an operating means for operating said valve member in a direction opposite the one intersecting direction to move said valve member to a second terminal position opposite to the first terminal position, resisting the biasing force of said biasing means; and a communicating means for causing said first and second suction passages to communicate with each other only when said valve member is in one of the first terminal position and the second terminal position, said communicating means being provided in said valve member;

wherein an adsorptive member is connected to said first suction passage, and a suction tube for linking to a vacuum source is connected to said second suction passage wherein the forceps body includes a bypass between said valve chamber and said first suction passage for causing said first suction passage to communicate with the atmosphere when said valve member is situated in a closing position constituted by one of the first terminal position and the second terminal position where communication between said first suction passage and said second passage is shut off; and for shutting off the communication between said first suction passage and the atmosphere by closing said bypass with a side surface of said valve member when said valve member is situated in an open position constituted by the other of the first terminal position and the second terminal position where said first suction passage is allowed to communicate with said second suction passage.

2. A vacuum-forceps as set forth in claim 1, wherein said valve chamber and said valve member have a cylindrical configuration, respectively, and said communicating means of said valve member is an annular ventilation groove formed along the circumference of said valve member.

3. A vacuum-forceps as set forth in claim 1, wherein said forceps body is composed of polytetrafluoroethylene, and said valve member is composed of polychlorotrifluoroethylene.

4. A vacuum-forceps comprising: a forceps body including first and second suction passages which coordinate with each other in a longitudinal direction and a valve chamber so disposed as to intersect said two suction passages, said forceps body being composed of an anticorrosive material having a relatively low hardness;

a valve member formed of an anticorrosive material having a comparatively high hardness, said valve member being accommodated in said valve chamber;

a biasing means for biasing said valve member in one intersecting direction to maintain said valve member in a first terminal position;

an operating means for operating said valve member in a direction opposite the one intersecting direction to move said valve member to a second terminal position opposite to the first terminal position, resisting the biasing force of said biasing means; and a communicating means for causing said first and second suction passages to communicate with each other only when said valve member is in one of the first terminal position and the second terminal position, said communicating means being provided in said valve member;

wherein an adsorptive member is connected to said first suction passage, and a suction tube for linking to a vacuum source is connected to said second suction passage;

wherein: said operating means comprises an operating spindle jutting out in one direction of said valve member; a stopper having a central hole, through which said operating spindle is passed; a push button being attached to an end portion of said operating spindle; a fit-in recessed portion being formed in an end portion, positioned in one direction, of said valve chamber; a top-conical hole leading to said fit-in recessed portion; said valve member being accommodated in said valve chamber; said stopper being installed in said fit-in recessed portion to be secured thereto by a split ring resiliently secured to the inside of said top-conical hole; said biasing means including a spring spanned between a wall, positioned in the other direction, of said valve member; and said wall, positioned in the other direction, of said valve chamber being formed with an air hole.

5. A vacuum-forceps as set forth in claim 4, wherein said stopper and said push button are made of polychlorotrifluoroethylene.

6. A vacuum-forceps as set forth in claim 4, wherein said operating spindle is constructed in such a manner that a metallic core member is embedded in a shaft made of polychlorotrifluoroethylene.

7. A vacuum-forceps as set forth in claim 4, wherein said adsorptive member consists of an adsorptive plate, a ventilation tube and a spherical connector member, said forceps body having a tip end, with seating means receiving said spherical connector in an orbitally adjustable manner.

8. A vacuum-forceps as set forth in claim 7, wherein said spherical member is composed of polychlorotrifluoroethylene.

9. A vacuum-forceps as set forth in claim 7, wherein said ventilation tube is coated with polycholorotrifluoroethylene.

10. A vacuum-forceps as set forth in claim 7, wherein said adsorptive plate has a connection tube projected at a proximal end thereof and a connection hole formed in said connection tube, communicated with a surface of said adsorptive plate, and the ventilation tube has a tip end provided with an external thread which engages in said connection hole.

11. A vacuum-forceps as set forth in claim 10, wherein an adsorptive recessed portion is formed in a surface of said adsorptive plate, and said adsorptive recessed portion is arranged to communicate with said connection hole.

12. A vacuum-forceps as set forth in claim 10, wherein at least one resilient impingement surface is provided on the surface of said adsorptive plate flush therewith, and an adsorptive ventilation groove leading to said connection hole is formed along the circumference of said resilient impingement surface.

13. A vacuum-forceps as set forth in claim 7, wherein said adsorptive plate has a connection tube projected at a proximal end thereof and a connection hole formed in said connection tube, communicated with a surface of said adsorptive plate, and the connection tube has a tip end press-fitted in said connection hole so as to be fixed thereto.

14. A vacuum-forceps as set forth in claim 13, wherein said ventilation tube tapers from a proximal end to a tip end thereof.

15. A vacuum-forceps as set forth in claim 7, wherein said adsorptive plate is composed of polychlorotrifluoroethylene.

16. A vacuum-forceps as set forth in claim 4, wherein a double-coupling is disposed between said second suction passage and said suction tube.

* * * * *